United States Patent
Abedifard et al.

(10) Patent No.: US 10,395,710 B1
(45) Date of Patent: Aug. 27, 2019

(54) MAGNETIC MEMORY EMULATING DYNAMIC RANDOM ACCESS MEMORY (DRAM)

(71) Applicant: Avalanche Technology, Inc., Fremont, CA (US)

(72) Inventors: Ebrahim Abedifard, San Jose, CA (US); Parviz Keshtbod, Los Altos Hills, CA (US); Ravishankar Tadepalli, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/985,268

(22) Filed: May 21, 2018

(51) Int. Cl.
| | |
|---|---|
| *G11C 7/06* | (2006.01) |
| *G11C 11/16* | (2006.01) |
| *H01L 27/24* | (2006.01) |
| *H01L 43/02* | (2006.01) |

(52) U.S. Cl.
CPC ............ *G11C 11/1673* (2013.01); *G11C 7/06* (2013.01); *G11C 11/161* (2013.01); *G11C 11/1653* (2013.01); *G11C 11/1659* (2013.01); *H01L 27/2427* (2013.01); *H01L 43/02* (2013.01)

(58) Field of Classification Search
CPC .......................................... G11C 11/16–1697
See application file for complete search history.

(56) References Cited

U.S. PATENT DOCUMENTS

| 7,751,226 B2* | 7/2010 | Kau .................. G11C 13/0004 365/148 |
| 10,224,367 B2* | 3/2019 | Yang ..................... H01L 27/224 |
| 2007/0091707 A1 | 4/2007 | Hidaka |
| 2008/0055972 A1 | 3/2008 | Oh et al. |
| 2013/0311717 A1 | 11/2013 | Kim et al. |
| 2014/0169069 A1* | 6/2014 | Oh ....................... G11C 11/1673 365/148 |
| 2014/0328118 A1* | 11/2014 | Hoya .................. G06F 11/1048 365/158 |
| 2015/0249096 A1 | 9/2015 | Lupino et al. |
| 2015/0261602 A1 | 9/2015 | Fujita |

* cited by examiner

*Primary Examiner* — Harry W Byrne
*Assistant Examiner* — R Lance Reidlinger
(74) *Attorney, Agent, or Firm* — Bing K. Yen

(57) ABSTRACT

The present invention is directed to a magnetic memory device comprising a memory array structure that includes a first memory array comprising a first plurality of memory cells and a second memory array comprising a second plurality of memory cells. Each memory cell of the first and second plurality of magnetic memory cells includes a magnetic memory element and a two-terminal selector coupled in series. The memory array structure further includes a first multiplexer coupled to a third plurality of first conductive lines with each line connected to a respective column of the first plurality of memory cells; a second multiplexer coupled to a fourth plurality of first conductive lines with each line connected to a respective column of the second plurality of memory cells; a sense amplifier, whose input is connected to the output of the first multiplexer and the output of the second multiplexer; and one or more latches coupled to the sense amplifier.

6 Claims, 10 Drawing Sheets

MAGNETIC MEMORY EMULATING DYNAMIC RANDOM ACCESS MEMORY (DRAM)

BACKGROUND

The present invention relates to a circuit for magnetic memory, and more particularly, to embodiments of a sensing circuit for magnetic random access memory to emulate dynamic random access memory (DRAM).

Magnetic random access memory (MRAM) is a new class of non-volatile memory. Unlike volatile memory, such as static random access memory (SRAM) or dynamic random access memory (DRAM) that loses the stored information when power is interrupted, non-volatile memory can retain the stored information even when powered off.

An MRAM device normally comprises an array of memory cells, each of which includes at least a magnetic memory element and an access transistor coupled in series between a bit line and a source line. Upon application of an appropriate current or voltage to the magnetic memory element in the programming step, the electrical resistance of the magnetic memory element would change accordingly, thereby switching the stored logic in the respective memory cell.

A magnetic memory element normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current or voltage to the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the two stable resistance states enable the MTJ to serve as a non-volatile memory element.

The fast switching speed and low power consumption of MRAM make it an ideal replacement for DRAM. FIG. 1 illustrates a circuit diagram for a conventional DRAM device including a sensing circuitry. The DRAM device 50 includes a first array of memory cells 52 and a second array of memory cells 54 connected to a first and a second sense amplifier 56 and 58. The first and second arrays of memory cells 52 and 54 include a plurality of memory cells 60A-60L, each of which includes an access transistor 62 coupled to a storage capacitor 64 that acts as a memory element for storing a data bit. A plurality of parallel word lines 66A-66F extend along a row direction. Each of the word lines 66A-66F connects to gates of the access transistors 62 of a respective row of the memory cells 60A-60L. A plurality of parallel bit lines 68A-68D extend along a column direction.

Each of the bit lines 68A-68D connects to drains of the access transistors 62 of a respective column of the memory cells 60A-60L. Each of the first and second sense amplifiers 56 and 58 is connected to one of the bit lines 68A-68B from the first array of memory cells 52 and one of the bit lines 68C-68D from the second array of memory cells 54.

In a sensing operation for reading a data bit from one of the memory cells 60A-60F, say the memory cell 60C connected to the bit line 68A and the word line 66B, all bit lines 68A-68D are first precharged to an intermediate voltage that is between a minimum voltage (e.g., 0 V) and and a maximum voltage (e.g., Vdd), which correspond to the voltages of the storage capacitor 64 in fully discharged and charged states, respectively. A voltage is then applied to the word line 66B to turn on the access transistors of all memory cells 60C-60D coupled thereto, thereby allowing the precharged bit lines 68A and 68B to electrically connect to the storage capacitors 64 of the memory cells 60C and 60D, respectively. Depending on the charge state of the storage capacitors 64 of the memory cells 60C and 60D, the voltages of the bit lines 68A and 68B may increase or decrease with respect to the initial precharged voltage. Using the sense amplifier 56, which consists essentially of a latch made of a pair of cross-connected inverters, the voltage of the bit line 68A connected to the sense amplifier 56 is compared with the precharged voltage of the bit line 68C that serves as the reference to determine the charge state of the storage capacitor 64 of the memory cell 60C. Owing to the positive feedback effect of the cross-connected inverters, the sense amplifier 56 amplifies the voltage difference between the two bit lines 68A and 68C until one of the two bit lines 68A and 68C is at the lowest voltage (e.g. 0 V) and the other one is at the highest voltage (e.g. Vdd), thereby latching the output of the sense amplifier 56 or the data bit corresponding to the memory cell 60C. Likewise, using the sense amplifier 58, the voltage of the bit line 68B is compared with the precharged voltage of the bit line 68D to determine the charge state of the storage capacitor 64 of the memory cell 60D. In the sensing operation described above, all memory cells 60C-60D connected to the selected word line 66B are sensed simultaneously, and the sense amplifier outputs are latched. A column address select then selects the desired latched bit corresponding to the memory cell 60C stored in the sense amplifier 56 for connection to the input/output (I/O) data bus.

Unlike DRAM that uses the relatively simple sense amplifier circuitry illustrated in FIG. 1, MRAM may require more complicated sense amplifier circuitry with significantly larger footprint to emulate DRAM, thereby adversely increasing the overhead for the memory device. For the foregoing reason, there is a need for a MRAM device that can emulate DRAM and that can be inexpensively manufactured.

SUMMARY

The present invention is directed to a memory device that satisfies this need. A magnetic memory device having features of the present invention comprises a memory array structure that includes a first memory array comprising a first plurality of magnetic memory cells and a second memory array comprising a second plurality of magnetic memory cells. Each memory cell of the first and second plurality of magnetic memory cells includes a magnetic memory element and a two-terminal selector coupled in series. The first memory array further includes a third plurality of first conductive lines, each of which coupled to a respective column of the first plurality of magnetic memory cells along a column direction; and a fourth plurality of second conductive lines, each of which coupled to a respective row of the first plurality of magnetic memory cells along a row direction. The second memory array further includes a fifth plurality of first conductive lines, each of which coupled to a respective column of the second plurality of magnetic memory cells along the column direction; and a sixth plurality of second conductive lines, each of which coupled to a respective row of the second plurality of magnetic memory cells along the row direction. The memory array structure further includes a first multiplexer, whose input is coupled to the third plurality of first conductive lines; a second multiplexer, whose input is coupled to the fifth plurality of first conductive lines; a sense amplifier, whose input is connected to the output of the first multiplexer and the output of the second multiplexer; and one or more latches coupled to the sense amplifier. The magnetic memory device may further includes one or more repeats of the memory array structures stitched together by the fourth plurality of second conductive lines and the sixth plurality of second conductive lines.

According to another aspect of the present invention, a method for reading a data bit stored in a magnetic memory array that includes multiple magnetic memory sub-arrays is disclosed. Each of the magnetic memory sub-arrays includes a plurality of magnetic memory cells arranged in rows and columns with each of the plurality of magnetic memory cells including a magnetic memory element and a two-terminal selector coupled in series; a plurality of word lines coupled to the plurality of magnetic memory cells along a row direction; and a plurality of bit lines coupled to the plurality of magnetic memory cells along a column direction and sharing a sense amplifier through a multiplexer. The multiple magnetic memory sub-arrays are skewered together along the row direction by the plurality of word lines. The method comprises the steps of raising potential of a selected word line, which is connected to a selected magnetic memory cell for sensing, among the plurality of word lines to a first voltage; turning on selectors of all magnetic memory cells connected to the selected word line, thereby activating a row of magnetic memory cells across all magnetic memory sub-arrays for sensing; consecutively sensing activated magnetic memory cells within each magnetic memory sub-array by the sense amplifier and latching sensed data bits in a group of latches, the sensed data bits in the group of latches of each magnetic memory sub-array collectively form a page of data bits; and selecting a data bit corresponding to the selected magnetic memory cell from the page of data bits and outputting the data bit corresponding to the selected magnetic memory cell to an input/output bus.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 1:
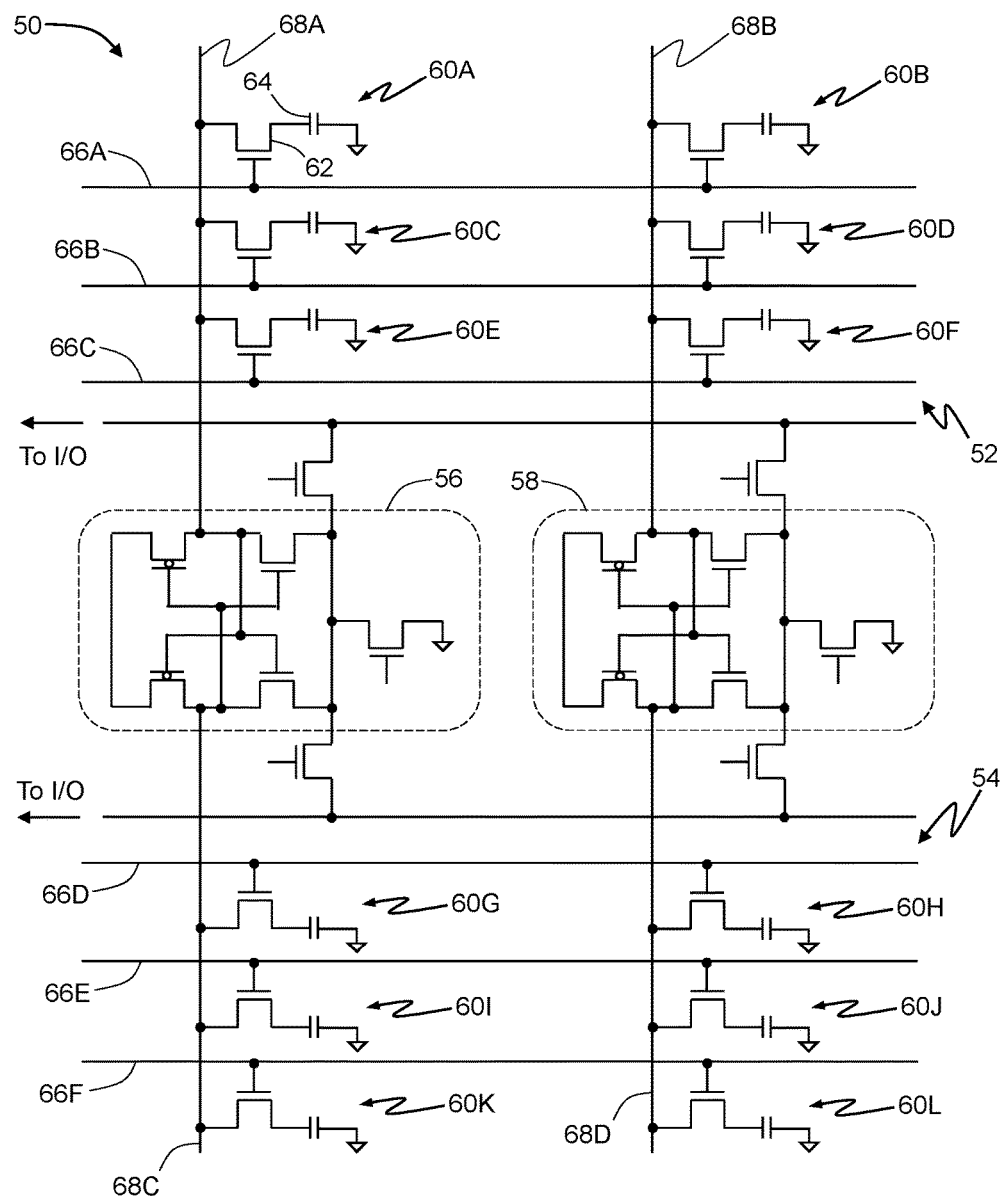
FIG. 1 is a schematic circuit diagram showing memory cell arrays and sensing circuitry for a dynamic random access memory (DRAM) device.
Figure 2:
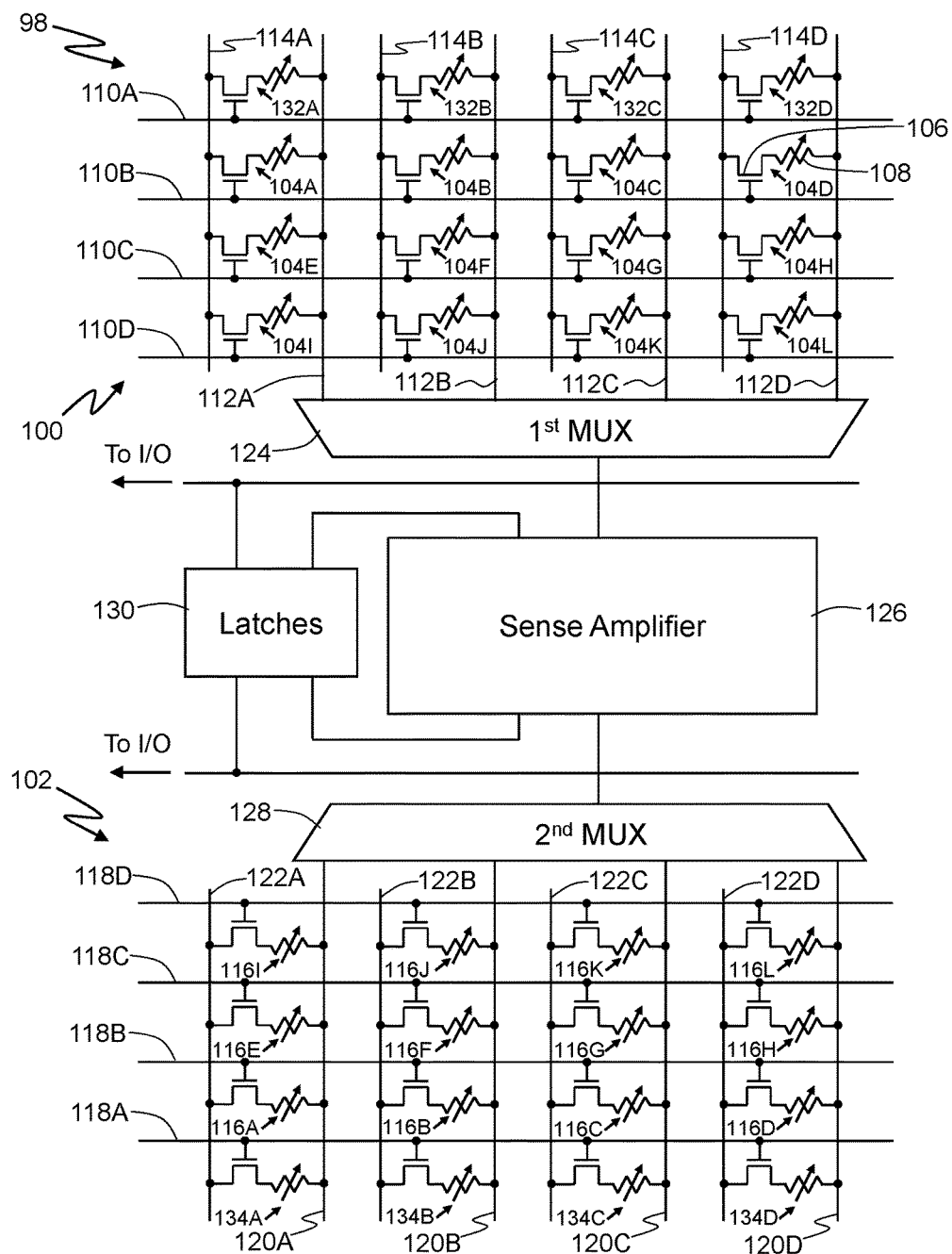
FIG. 2 is a schematic circuit diagram illustrating a memory array structure that includes arrays of magnetic memory cells and sensing circuitry in accordance with an embodiment of the present invention.

An exemplary embodiment of the present invention as applied to a magnetic random access memory (MRAM) device for emulating DRAM will now be described with reference to FIG. 2. Referring now to FIG. 2, the MRAM device comprises a memory array structure 98 that includes a first memory array 100 and a second memory array 102. The first memory array 100 includes a plurality of magnetic memory cells arranged in rows and columns, as represented by magnetic memory cells 104A-104L. Each of the magnetic memory cells 104A-104L comprises an access transistor 106 and a magnetic memory element 108 coupled in series. The first memory array 100 further includes a plurality of word lines represented by word lines 110A-110D extending along a row direction, a plurality of first conductive lines represented by lines 112A-112D extending along a column direction, and a plurality of second conductive lines represented by lines 114A-114D extending along the column direction. Each of the word lines 110A-110D is connected to the gates of the access transistors 106 of a respective row of the magnetic memory cells 104A-104L along the row direction. Each of the first conductive lines 112A-112D is connected to the magnetic memory elements 108 of a respective column of the magnetic memory cells 104A-104L along the column direction. Each of the second conductive lines 114A-114D is connected to the source or drain of the access transistors 106 of a respective column of the magnetic memory cells 104A-104L along the column direction. The first and second conductive lines 112A-112D and 114A-114D may function as bit lines and sources lines, respectively, or vice versa.

The second memory array 102 includes a plurality of magnetic memory cells arranged in rows and columns, as represented by magnetic memory cells 116A-116L. Each of the magnetic memory cells 116A-116L comprises the access transistor 106 and the magnetic memory element 108 coupled in series. The second memory array 102 further includes a plurality of word lines represented by word lines 118A-118D extending along the row direction, a plurality of first conductive lines represented by lines 120A-120D extending along the column direction, and a plurality of second conductive lines represented by lines 122A-122D extending along the column direction. Each of the word lines 118A-118D is connected to the gates of the access transistors 106 of a respective row of the magnetic memory cells 116A-116L along the row direction. Each of the first conductive lines 120A-120D is connected to the magnetic memory elements 108 of a respective column of the magnetic memory cells 116A-116L along the column direction. Each of the second conductive lines 122A-122D is connected to the source or drain of the access transistors 106 of a respective column of the magnetic memory cells 116A-116L along the column direction. The first and second conductive lines 120A-120D and 122A-122D may function as bit lines and sources lines, respectively, or vice versa.

The first conductive lines 112A-112D of the first memory array 100 are connected to the input of a first multiplexer (MUX) 124, the output of which is connected to a sense amplifier 126. Likewise, the first conductive lines 120A-120D of the second memory array 102 are connected to the input of a second multiplexer (MUX) 128, the output of which is connected to the same sense amplifier 126. The sense amplifier 126 is operable to sequentially or consecutively sense the voltage signals from the first conductive lines 112A-112D through the first MUX 124 or the voltage signals from the first conductive lines 120A-120D through the second MUX 128.

The input of the sense amplifier 126 is connected to the output of the first and second MUXs 124 and 128, one of which provides the sensing signal while the other one of which provides the reference signal. The output of the sense amplifier 126 is connected to a group of latches 130 for caching or latching multiple data bits corresponding to a row of magnetic memory cells.

Figure 3:
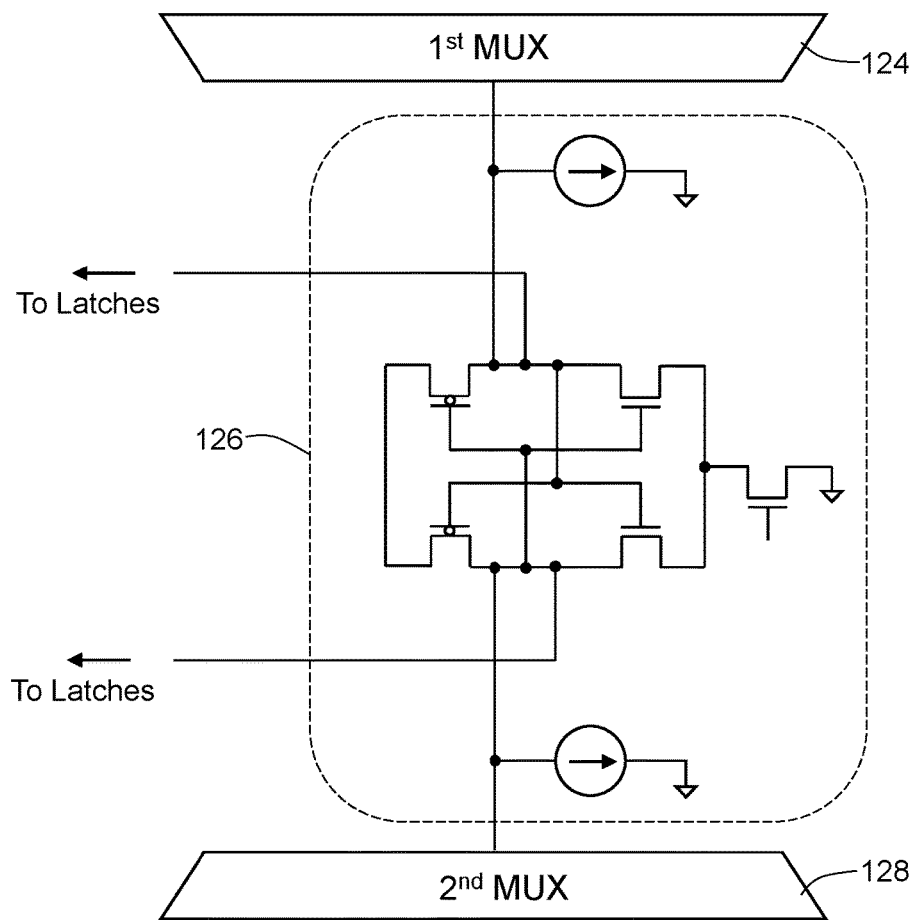
FIG. 3 is a schematic circuit diagram illustrating an exemplary circuit for the sense amplifier of the present invention.
Figure 4:
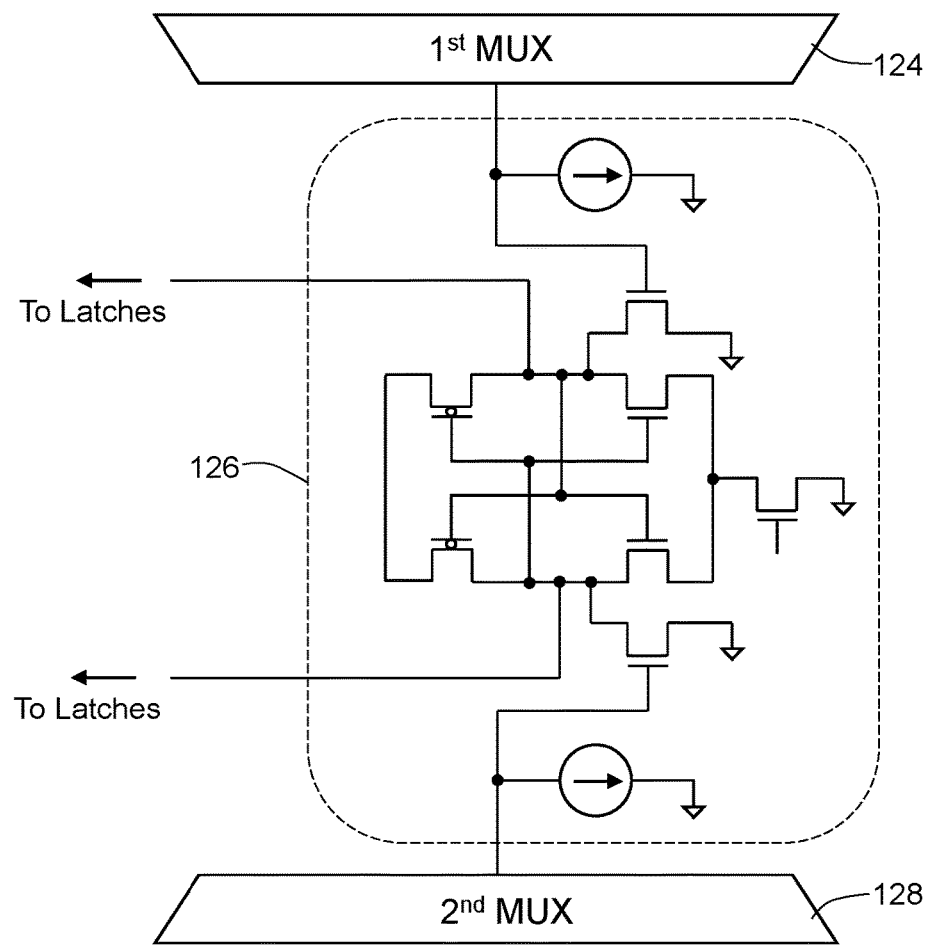
FIG. 4 is a schematic circuit diagram illustrating another exemplary circuit for the sense amplifier of the present invention.

FIG. 3 is a schematic circuit diagram showing an exemplary design for the sense amplifier 126 that includes a latch and two current sources. FIG. 4 shows another exemplary design for the sense amplifier 126 that includes two current sources. Other designs for the sense amplifier 126 may also be used to sense the magnetic memory cells Referring back to FIG. 2, the first memory array 100 may optionally include one or more rows of reference cells represented by reference cells 132A-132D. Likewise, the second memory array 102 may optionally include one or more rows of reference cells represented by reference cells 134A-134D. Each of the reference cells 132A-132D and 134A-134D may include a variable resistor like the magnetic memory element 108 or a resistor with substantially fixed resistance. In an embodiment, each of the reference cells 132A-132D and 134A-134D includes an access transistor and a magnetic memory element coupled in series. The reference cells 132A-132D of the first memory array 100 are used to provide reference signals to the sense amplifier 126 when sensing the electrical resistance of the magnetic memory cells 116A-116L of the second memory array 102. Conversely, the reference cells 134A-134D of the second memory array 102 are used to provide reference signals to the sense amplifier 126 when sensing the electrical resistance of the magnetic memory cells 104A-104L of the first memory array 100.

In a sensing operation, the data bits, in the form of electrical resistance, of a row of magnetic memory cells (e.g., cells 104E-104H) connected to a word line (e.g., line 110C) are sequentially read by the sense amplifier 126 through the first MUX 124 and then latched or cached in the group of latches 130. A column address select (not shown) connected to the group of latches 130 then selects the desired data bit(s) stored in the group of latches 130 for connection to the I/O data bus. In an embodiment, the group of latches 130 has the same number of latches as the number of the first conductive lines in the first memory array 100 or the second memory array 102 that connect to the MUX 124 or 128. For example and without limitation, if each of the first and second memory arrays 100 and 102 includes 32 first conductive lines sharing the sense amplifier 126, then the group of latches 130 may include 32 latches for storing 32 data bits. In another embodiment, the number of latches in the group of latches 130 is one less than the number of the first conductive lines in the first memory array 100 or the second memory array 102. For example and without limitation, if each of the first and second memory arrays 100 and 102 includes 32 first conductive lines sharing the sense amplifier 126, then the group of latches 130 may include 31 latches for storing 31 data bits and the sense amplifier 126 itself may be used to store the $32^{nd}$ data bit.

While the exemplary embodiment of FIG. 2 shows each of the first and second memory arrays 100 and 102 including 12 magnetic memory cells 104A-104L or 116A-116L and four word lines 110A-110D or 118A-118D, the present invention may be practiced with any number of magnetic memory cells and word lines. Likewise, although the same figure shows four first conductive lines 112A-112D or 120A-120D from each of the memory arrays 100 and 102 can connect to the sense amplifier 126 through the respective MUX 124 or 128, the present invention can accommodate any number of first conductive lines from two to a number corresponding to the number of bits in a memory page. For example and without limitation, each of the first and second memory arrays 100 and 102 may have any number of first conductive lines from 2 to 16,384 sharing the sense amplifier 126 for a memory page size requirement of 16,384 bits. For embodiments where the number of the first conductive lines in each of the memory arrays 100 and 102 is less than the number of bits required for a memory page, the memory array structure 98 of FIG. 2 and repeats thereof may be stitched or skewered together by common word lines as shown in FIG. 5 to meet the page size requirement.

Figure 5:
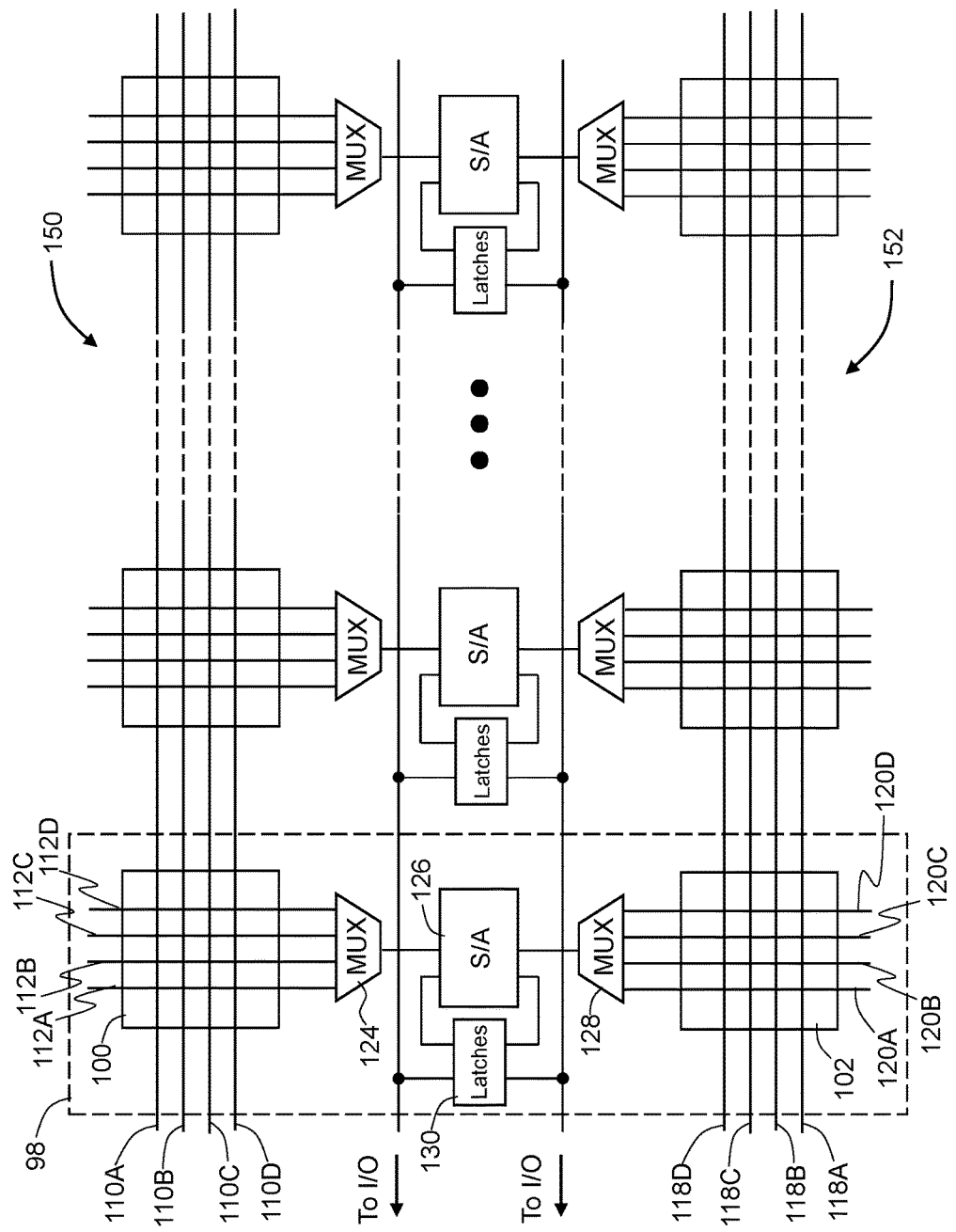
FIG. 5 is a schematic diagram showing a memory device formed by the memory array structure of FIG. 2 and one or more repeats thereof.

Referring now to FIG. 5, the memory array structure 98 of FIG. 2 and one or more repeats thereof are stitched or skewered together along the row direction by a plurality of common word lines represented by word lines 110A-110D and 118A-118D. For reasons of clarity and brevity, the magnetic memory cells 104A-104L and 116A-116L, the optional reference cells 132A-132D and 134A-134D, and the second conductive lines 114A-114D and 122A-122D are not shown in FIG. 5. The first memory array 100 of each memory array structure 98 collectively form a first super memory array 150 and share the plurality of word lines 110A-110D. Likewise, the second memory array 102 of each memory array structure 98 collectively form a second super memory array 152 and share the plurality of word lines 118A-118D.

The minimum number of units of the memory array structure 98 needed in a DRAM-compatible MRAM memory device may depend on the memory page size of the DRAM and the number of first conductive lines sharing a sense amplifier through an MUX. For example and without limitation, an MRAM device having 512 units of the memory array structures 98 with each memory array structure including 32 first conductive lines sharing a sense amplifier through an MUX would result in a memory page size of 16,384 bits. In a sensing operation for such a device, a word line is activated to simultaneously activate a row of 16,384 magnetic memory cells across all 512 units of the memory array structures 98. Within each memory array structure 98, the stored data bits of activated magnetic memory cells are sequentially read and latched in the group of latches 130 or a combination of latches 130 and sense amplifier 126. After all data bits corresponding to the activated row of magnetic memory cells are cached or latched in the group of latches or latches/sense amplifiers combination for every memory array structure 98, one or more desired data bits within the memory page may be extracted and output to I/O bus through a column address select (not shown).

An embodiment of the present invention as applied to the sensing operation of the MRAM device will now be described with reference to FIGS. 2 and 5. To read a data bit from a magnetic memory cell in the first super memory array 150, all second conductive lines in the first super memory array 150 are simultaneously raised to a voltage, say Vdd, and the word line connected to the magnetic memory cell for sensing is activated, thereby activating all magnetic memory cells connected to the word line. The activated magnetic memory cells within each unit of the memory array structure 98 are sequentially or consecutively sensed by the respectively sense amplifier 126 through the respective first MUX 124. The data bits corresponding to the activated magnetic memory cells within each unit of the memory array structure 98 are latched in the group of latches 130. Data bits from each group of latches 130 may collectively form a page of data bits. The desired data bit is extracted from the page of latched data bits by a column address select (CAS) and output to I/O memory bus.

Figure 6:
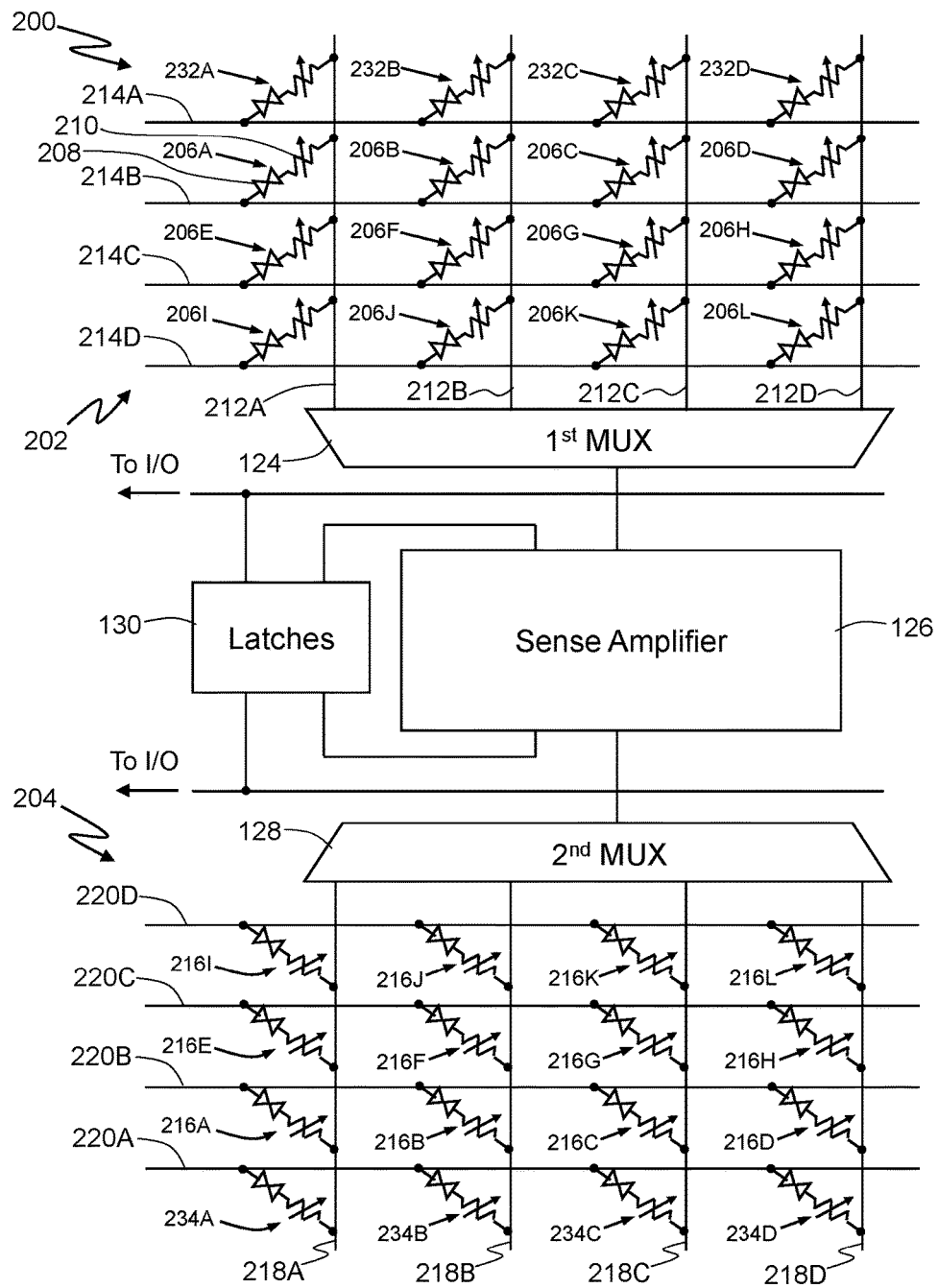
FIG. 6 is a schematic circuit diagram illustrating a memory array structure that includes arrays of magnetic memory cells and sensing circuitry in accordance with another embodiment of the present invention.

Another embodiment of the present invention as applied to an MRAM device for emulating DRAM will now be described with reference to FIG. 6. Referring now to FIG. 6, the MRAM device comprises a memory array structure 200 that includes a first memory array 202 and a second memory array 204. The first memory array 202 includes a plurality of magnetic memory cells arranged in rows and columns, as represented by magnetic memory cells 206A-206L. Each of the magnetic memory cells 206A-206L comprises a two-terminal selector 208 and a magnetic memory element 210 coupled in series. The first memory array 202 further includes a plurality of first conductive lines represented by lines 212A-212D extending along a column direction and a plurality of second conductive lines represented by lines 214A-214D extending along a row direction. Each of the first conductive lines 212A-212D is connected to the magnetic memory elements 210 of a respective column of the magnetic memory cells 206A-206L along the column direction. Each of the second conductive lines 214A-214D is connected to one end of the two-terminal selectors 208 of a respective row of the magnetic memory cells 206A-206L along the row direction. The first and second conductive lines 212A-212D and 214A-214D may function as bit lines and word lines, respectively, or vice versa.

The second memory array 204 includes a plurality of magnetic memory cells arranged in rows and columns, as represented by magnetic memory cells 216A-216L. Each of the magnetic memory cells 216A-216L comprises the two-two terminal selector 208 and the magnetic memory element 210 coupled in series. The second memory array 204 further includes a plurality of first conductive lines represented by lines 218A-218D extending along the column direction and a plurality of second conductive lines represented by lines 220A-220D extending along the row direction. Each of the first conductive lines 218A-218D is connected to the magnetic memory elements 210 of a respective column of the magnetic memory cells 216A-216L along the column direction. Each of the second conductive lines 220A-220D is connected to one end of the two-terminal selector 208s of a respective row of the magnetic memory cells 216A-216L along the row direction. The first and second conductive lines 218A-218D and 220A-220D may function as bit lines and word lines, respectively, or vice versa.

The connection or stacking order of the two-terminal selector 208 and the magnetic memory element 210 of each of the magnetic memory cells 206A-206L and 216A-216L may be inverted such that each selector 208 is coupled one of the first conductive lines 212A-212D and 218A-218D, and each magnetic memory element 210 is coupled to one of the second conductive lines 214A-214D and 220A-220D.

With continuing reference to FIG. 6, the first conductive lines 212A-212D of the first memory array 202 are connected to the input of the first multiplexer (MUX) 124, the output of which is connected to the sense amplifier 126, analogous to the memory array structure 98 shown in FIG. 2. Likewise, the first conductive lines 218A-218D of the second memory array 204 are connected to the input of the second multiplexer (MUX) 128, the output of which is connected to the same sense amplifier 126. The sense amplifier 126 is operable to sequentially or consecutively sense the voltage signals from the first conductive lines 212A-212D through the first MUX 124 or the voltage signals from the first conductive lines 218A-218D through the second MUX 128.

The input of the sense amplifier 126 is connected to the output of the first and second MUXs 124 and 128, one of which provides the sensing signal while the other one of which provides the reference signal. The output of the sense amplifier 126 is connected to the group of latches 130 for caching or latching multiple bits of data corresponding to a row magnetic memory cells.

The first memory array 202 may optionally include one or more rows of reference cells represented by reference cells 232A-232D. Likewise, the second memory array 204 may optionally include one or more rows of reference cells represented by reference cells 234A-234D. Each of the reference cells 232A-232D and 234A-234D may include a variable resistor like the magnetic memory element 210 or a resistor with substantially fixed resistance. In an embodiment, each of the reference cells 232A-232D and 234A-234D includes a selector and a magnetic memory element coupled in series. The reference cells 232A-232D of the first memory array 202 are used to provide reference signals to the sense amplifier 126 when sensing the electrical resistance of the magnetic memory cells 216A-216L of the second memory array 204. Conversely, the reference cells 234A-234D of the second memory array 204 are used to provide reference signals to the sense amplifier 126 when sensing the electrical resistance of the magnetic memory cells 206A-206L of the first memory array 202.

While the exemplary embodiment of FIG. 6 shows each of the first and second memory arrays 202 and 204 including 12 magnetic memory cells 206A-206L or 216A-216L and four second conductive lines 214A-214D or 220A-220D, the present invention may be practiced with any number of magnetic memory cells and second conductive lines. Likewise, although the same figure shows four first conductive lines 212A-212D or 218A-218D from each of the memory arrays 202 and 204 can connect to the sense amplifier 126 through the respective MUX 124 or 128, the present invention can accommodate any number of first conductive lines from two to a number corresponding to the number of bits in a memory page.

Figure 7A:
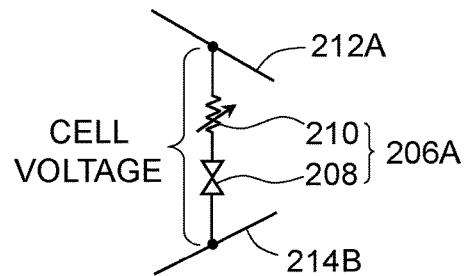
FIGS. 7A and 7B illustrate a magnetic memory cell and I-V plot thereof, respectively.
Figure 7B:
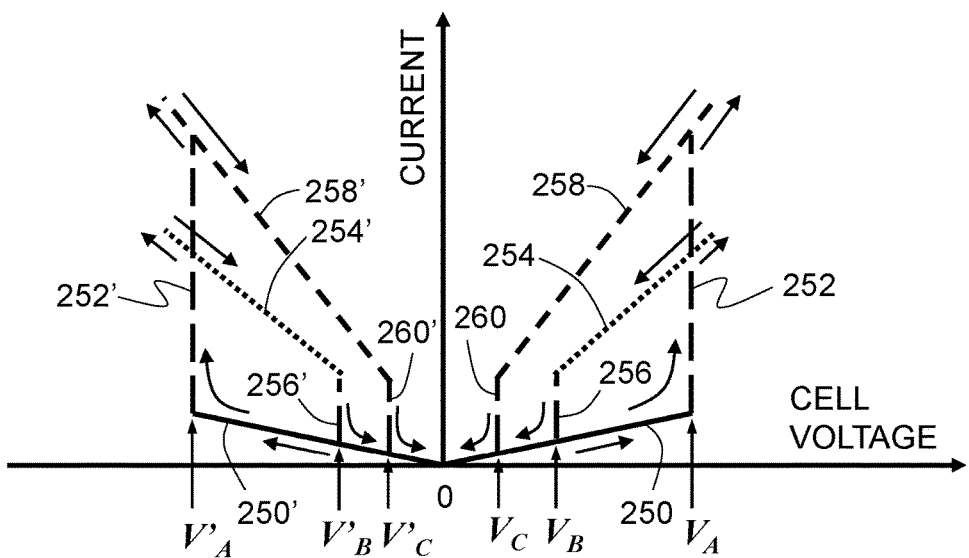

FIGS. 7A and 7B show a schematic circuit diagram for an exemplary magnetic memory cell 206A, which includes the selector 208 and the magnetic memory element 210 coupled in series between the first conductive line 212A and the second conductive line 214B, and the corresponding I-V response plot, respectively. As the cell voltage, which is the sum of the selector voltage and the memory element voltage, increases to near a threshold voltage $V_A$, the current slightly increases and the selector 208 remains substantially insulative or in the off-state, characterized by a curve 250. At or near the threshold voltage $V_A$, the current rapidly increases as the selector 208 undergoes a transition from the nominally insulative state (off-state) to the nominally conductive state (on-state) characterized by a curve 252.

With continuing reference to FIG. 7B, after the selector 208 of the magnetic memory cell 206A is turned on at or near $V_A$, the I-V response will follow a curve 254 with further increase in the cell voltage beyond $V_A$ when the magnetic memory element 210 is in the high resistance state without switching the resistance state thereof. As the cell voltage decreases to near a holding voltage $V_B$, the current decreases following the curve 254, while the selector 208 remains in the on-state (conductive state). At or near the holding voltage $V_B$, the current rapidly decreases as characterized by a curve 256, indicating the transition of the selector 208 from the on-state (conductive state) back to the off-state (insulative state). Further decrease in the cell voltage beyond $V_B$ causes the current to eventually reach zero at about 0 V while the selector 208 remains in the nominally insulative state as depicted by the curve 250.

When the magnetic memory element 210 is in the low resistance state, the I-V response of the magnetic memory cell 206A will follow a curve 258 after the selector 208 is turned on at or near $V_A$. With further increase in the cell voltage beyond $V_A$, the selector 208 will remain in the on-state as the current increases. As the cell voltage decreases to near another holding voltage $V_C$, the current decreases following the curve 258, while the selector 208 remains in the nominally conductive state. At or near the holding voltage $V_C$, the current rapidly decreases as characterized by a curve 260, indicating the transition of the selector 208 from the nominally conductive state back to the nominally insulative state. Further decrease in the cell voltage beyond $V_C$ causes the current to eventually reach zero at about 0 V while the selector 208 remains in the nominally insulative state as depicted by the curve 250.

The polarity of the applied voltage to the magnetic memory cell 206A may be reversed. When the magnetic memory element 210 is in the high resistance state, the I-V response may follow curves 250', 252', 254', 256', and back to curve 250' as the cell voltage increases from 0 V to a point beyond $V'_A$ and back. The insulative-to-conductive transition and the conductive-to-insulative transition occur at or near $V'_A$ and $V'_B$, respectively. When the magnetic memory element 210 is in the low resistance state, the I-V response may follow curves 250', 252', 258', 260', and back to curve 250' as the cell voltage increases from 0 V to a point beyond $V'_A$ and back. The insulative-to-conductive transition and the conductive-to-insulative transition occur at or near $V'_A$ and $V'_C$, respectively. Although FIG. 7B shows the I-V response plot of the memory cell 206A being substantially symmetric with respect to the current (vertical) axis, the present invention may be practiced even if the I-V response plot of the memory cell 206A is substantially asymmetric (i.e. $|V_A| \neq |V'_A|$ and/or $|V_B| \neq |V'_B|$ and/or $|V_C| \neq |V'_C|$).

Figure 8:
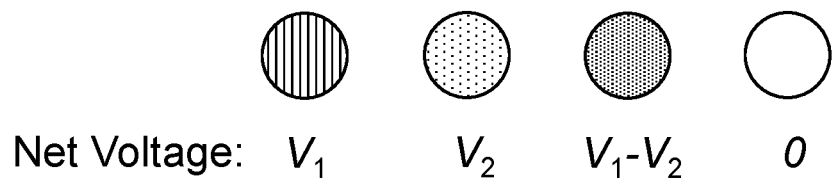
FIG. 8 illustrates a method for selecting a magnetic memory cell for sensing or programming.
Figure 8:
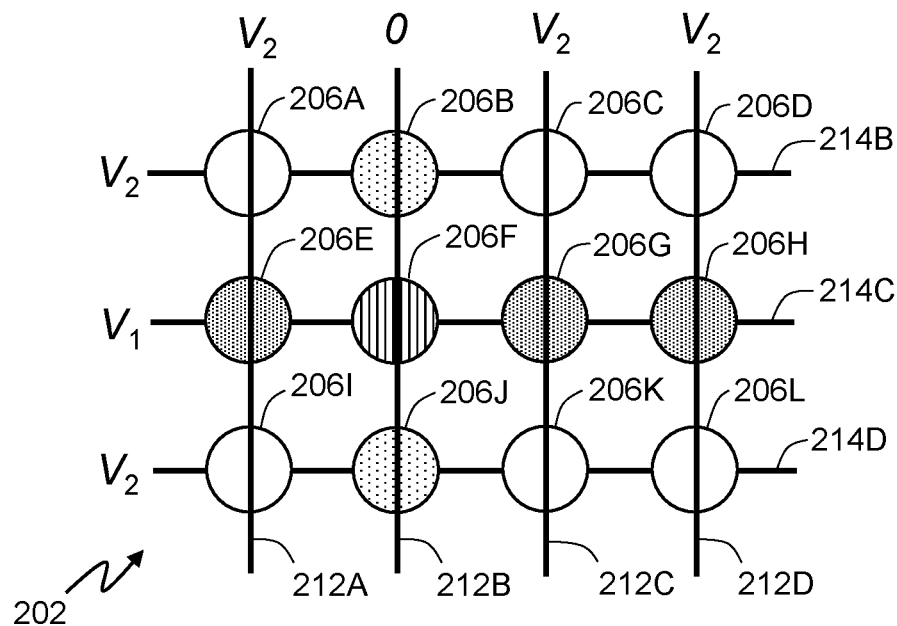

FIG. 8 illustrates a scheme for selecting a magnetic memory cell (e.g., cell 206F) in the first memory array 202 for sensing or programming by turning on the selector 208 of the selected memory cell 206F. The magnetic memory cell 206F is selected by applying a voltage, $V_1$, to one of the second conductive lines 214C coupled thereto, while grounding one of the first conductive lines 212B connected to the selected memory cell 206F, thereby generating a net potential difference of $V_1$ across the magnetic memory cell 206F. The voltage of $V_1$ is greater than the threshold voltage of $V_A$ for the selector 208 to turn on. Meanwhile, to minimize current leakage and prevent accidental programming of the unselected memory cells, a voltage of about $V_2$ is applied to the unselected second conductive lines 214B and 214D and the unselected first conductive lines 212A and 212C-212D, resulting in a net potential difference of $V_2$ across the unselected memory cells 206B and 206J that are coupled to the selected first conductive line 212B and a net potential difference of $V_1$-$V_2$ across the unselected memory cells 206E, 206G, and 206H that are coupled to the selected second conductive line 214C. The cell voltage of $V_1$ is greater than $V_A$ to ensure that the selector 208 of the selected memory cell 206F becomes conductive, while the cell voltages of $V_2$ and $V_1$-$V_2$ are not high enough for the selectors 208 of the unselected memory cells 206B, 206J, 206E, 206G, and 206H to become conductive. The rest of the unselected memory cells that are not connected to the selected first conductive line 212B or the selected second conductive line 214C experience essentially no potential drop thereacross.

Figure 9:
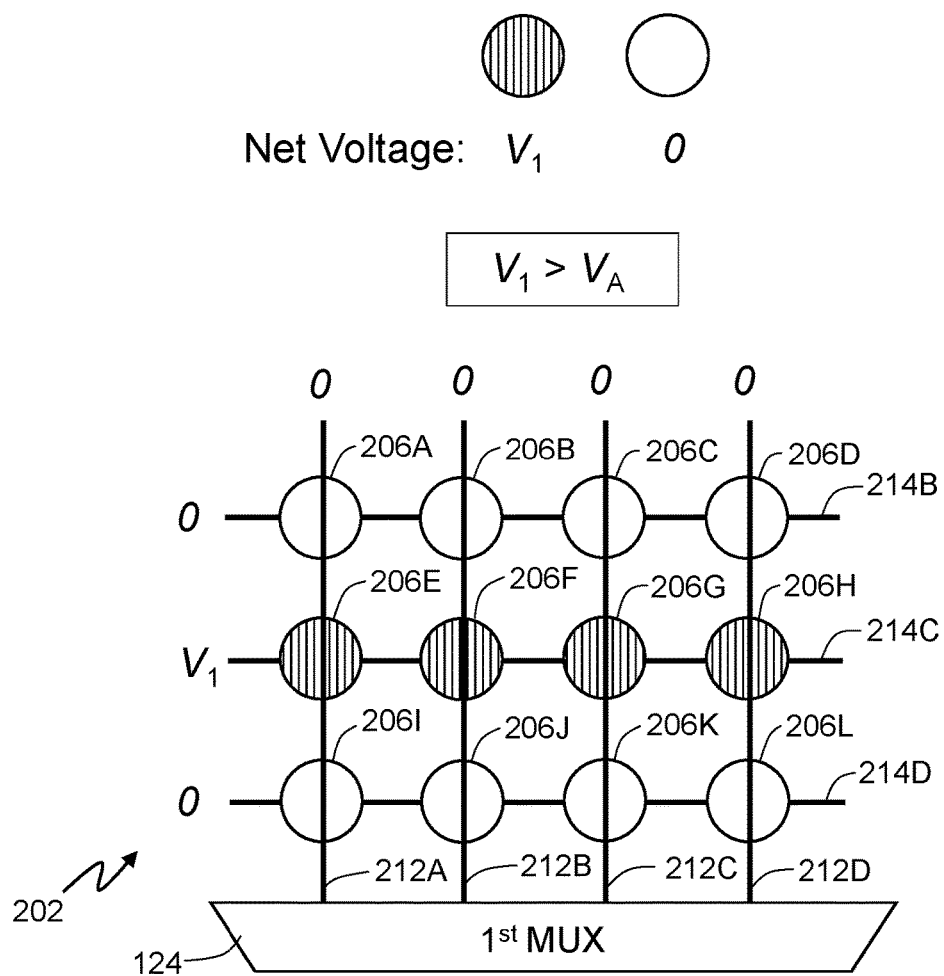
FIG. 9 illustrates a method for selecting a row of magnetic memory cells for sensing in accordance with an embodiment of the present invention.

An embodiment of the present invention as applied to a sensing method for the memory array structure 200 will now be described with reference to FIGS. 6 and 9. To sense the resistance state of a magnetic memory cell (e.g., cell 206F), a voltage of $V_1$, which is greater than the threshold voltage $V_A$ of the selector 208, is applied to the second conductive line 214C, while grounding all other first and second conductive lines 214B, 214D, and 212A-212D, thereby turning on all selectors 208 of the magnetic memory cells 206E-206H coupled to the second conductive line 214C. After the selectors 208 of the magnetic memory cells 206E-206H turns on, the voltage applied to the second conductive line 214C may be lowered to a level below $V_A$ to provide lower sensing currents through the respective magnetic memory elements of the magnetic memory cells 206E-206H. With the second conductive line 214C activated, the data bits, in the form of electrical resistance, of the row of the magnetic memory cells 206E-206H are sequentially read by the sense amplifier 126 through the first MUX 124 and then latched or cached in the group of latches 130. A CAS (not shown) connected to the group of latches 130 then selects the desired data bit (cell 206F) stored in the group of latches 130 for connection to the I/O data bus. Multiple bits of data stored in the same row of magnetic memory cells 206E-206H may also be rapidly extracted from the group of latches 130 by the CAS.

Referring back to FIG. 6, each of the first and second memory arrays 202 and 204 may have the number of first conductive lines required for a memory page. In such a case, each row of the magnetic memory cells in the first and second memory arrays 202 and 204 stores a page of data bits. For embodiments where the number of the first conductive lines in each of the memory arrays 202 and 204 is less than the number of bits required for a memory page, the memory array structure 200 of FIG. 6 and one or more repeats thereof may be stitched together by common second conductive lines as shown in FIG. 10 to meet the page size requirement.

Figure 10:
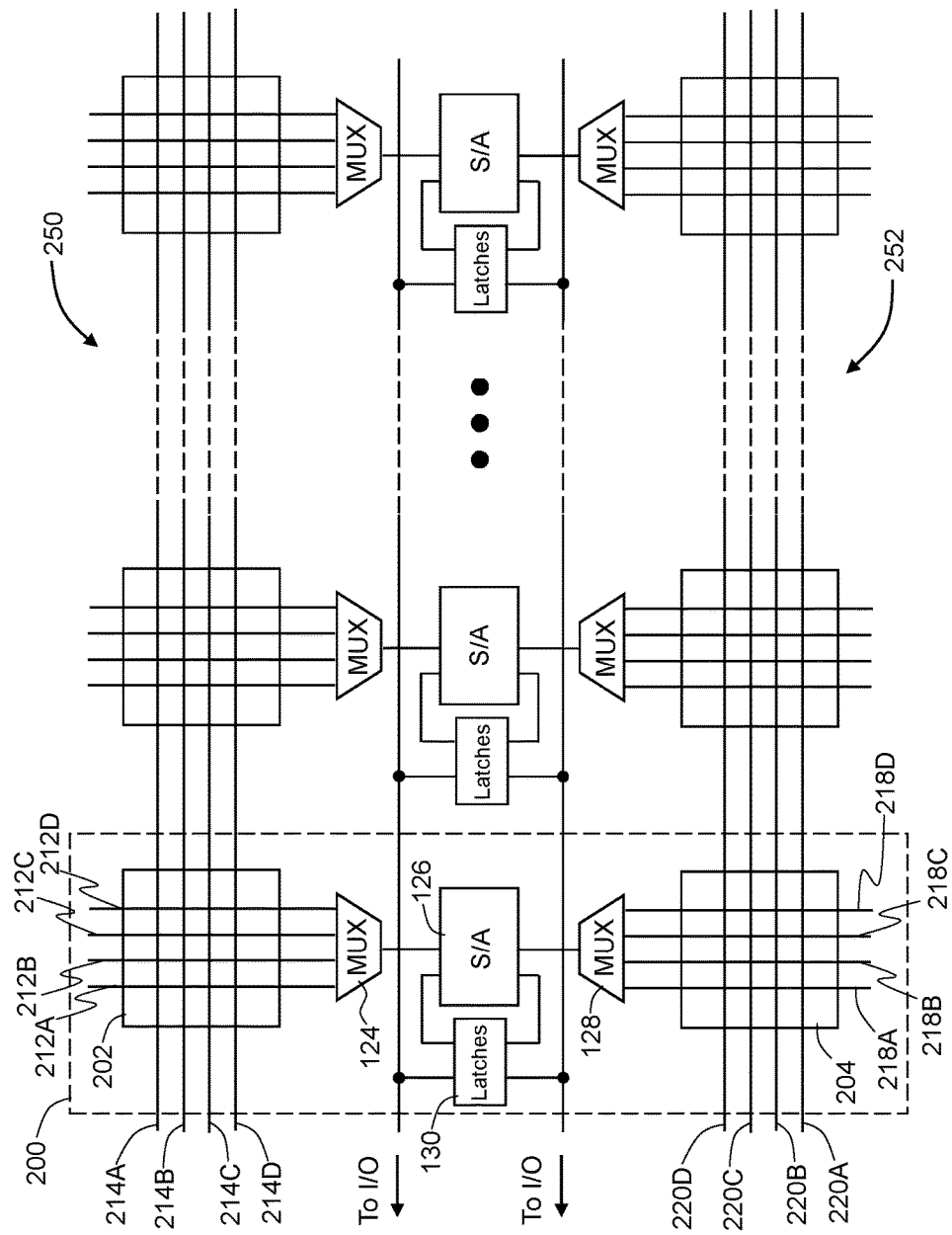
FIG. 10 is a schematic diagram showing a memory device formed by the memory array structure of FIG. 6 and one or more repeats thereof.

Referring now to FIG. 10, the memory array structure 200 of FIG. 6 and one or more repeats thereof are stitched or skewered together along the row direction by multiple common second conductive lines represented by lines 214A-214D and 220A-220D. For reasons of clarity and brevity, the magnetic memory cells 206A-206L and 216A-216L and the optional reference cells 232A-232D and 234A-234D are not shown in FIG. 10. The first memory array 202 of each memory array structure 200 collectively form a first super memory array 250 and share a plurality of second conductive lines represented by lines 214A-214D. Likewise, the second memory array 204 of each memory array structure 200 collectively form a second super memory array 252 and share a plurality of second conductive lines represented by lines 220A-220D.

The minimum number of units of the memory array structures 200 needed in a DRAM-compatible MRAM memory device may depend on the memory page size of the DRAM and the number of first conductive lines sharing a sense amplifier through an MUX. For example and without limitation, an MRAM device having 512 units of the memory array structures 200 with each memory array structure including 32 first conductive lines sharing a sense amplifier through an MUX would result in a memory page size of 16,384 bits. In a sensing operation for such a device, a second conductive line is activated to simultaneously activate a row of 16,384 magnetic memory cells across all 512 units of the memory array structures 200. Within each memory array structure 200, the stored data bits of activated magnetic memory cells are sequentially or consecutively read by the sense amplifier 126 and latched in the group of latches 130 or a combination of latches 130 and sense amplifier 126. After the page of data bits corresponding to the activated row of magnetic memory cells are latched in the groups of latches or latches/sense amplifiers combination, the desired data bit(s) within the memory page are extracted and output to I/O bus through a CAS (not shown).

An embodiment of the present invention as applied to the sensing operation of the MRAM device will now be described with reference to FIGS. 9 and 10. To read a data bit from a magnetic memory cell in the first super memory array 250, the second conductive line coupled to the magnetic memory cell to be sensed is raised to a voltage of $V_1$ that is higher than the threshold voltage of the selector $V_A$, while all other first and second conductive lines are maintained at 0 V, thereby turning on the selectors of all magnetic memory cells connected to the activated second conductive line. After the selectors are turned on, the applied voltage to the activated second conductive line may be maintained at $V_1$ or lowered to a level below $V_A$ to continue to the sensing operation. The activated magnetic memory cells within each unit of the memory array structure 200 are sequentially or consecutively sensed by the respectively sense amplifier 126 through the respective first MUX 124. The data bits corresponding to the activated magnetic memory cells within each unit of the memory array structure 200 are latched in the group of latches 130. Data bits from each group of latches 130 may collectively form a page of data bits. The desired data bit is extracted from the page of latched data bits by a CAS and output to the I/O memory bus.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A method for reading a data bit stored in a magnetic memory array that includes multiple magnetic memory sub-arrays, each of which including a plurality of magnetic memory cells arranged in rows and columns with each of said plurality of magnetic memory cells including a magnetic memory element and a two-terminal selector coupled in series, a plurality of word lines coupled to said plurality of magnetic memory cells along a row direction, and a plurality of bit lines coupled to said plurality of magnetic memory cells along a column direction and sharing a sense amplifier through a multiplexer, said multiple magnetic memory sub-arrays being skewered together along said row direction by said plurality of word lines, the method comprising the steps of:

raising potential of a selected word line among said plurality of word lines to a first voltage, said selected word line connected to a selected magnetic memory cell for sensing;

turning on selectors of all magnetic memory cells connected to said selected word line, thereby activating a row of magnetic memory cells across all magnetic memory sub-arrays for sensing;

consecutively sensing activated magnetic memory cells within each magnetic memory sub-array by said sense amplifier and latching sensed data bits in a group of latches, said sensed data bits in said group of latches of each magnetic memory sub-array collectively form a page of data bits; and selecting a data bit corresponding to said selected magnetic memory cell from said page of data bits and outputting said data bit corresponding to said selected magnetic memory cell to an input/output bus.

2. The method of claim 1, wherein said first voltage is higher than a threshold voltage for said selector to turn on.

3. The method of claim 1 further including lowering said potential of said selected word line from said first voltage to a second voltage after the step of turning on selectors.

4. The method of claim 3, wherein said second voltage is lower than a threshold voltage for said selector to turn on.

5. The method of claim 1, wherein potential of word lines not connected to said selected magnetic memory cell and all bit lines are maintained at 0 V.

6. The method of claim 1, wherein the step of selecting a data bit is carried out by a column address select (CAS).

* * * * *